United States Patent
Hokenmaier

(10) Patent No.: US 7,112,895 B2
(45) Date of Patent: Sep. 26, 2006

(54) REDUCED POWER CONSUMPTION IN INTEGRATED CIRCUITS WITH FUSE CONTROLLED REDUNDANT CIRCUITS

(75) Inventor: Wolfgang Hokenmaier, Burlington, VT (US)

(73) Assignee: Infineon Technologies AG, Munich (DE)

( * ) Notice: Subject to any disclaimer, the term of this patent is extended or adjusted under 35 U.S.C. 154(b) by 315 days.

(21) Appl. No.: 10/641,812

(22) Filed: Aug. 15, 2003

(65) Prior Publication Data

US 2005/0036259 A1 Feb. 17, 2005

(51) Int. Cl.
*H02M 1/10* (2006.01)
*G11C 7/22* (2006.01)
*H01L 23/62* (2006.01)

(52) U.S. Cl. .................. 307/29; 257/209; 365/210
(58) Field of Classification Search ............... 356/210; 257/209; 307/29
See application file for complete search history.

(56) References Cited

U.S. PATENT DOCUMENTS

| | | | |
|---|---|---|---|
| 4,156,185 A * | 5/1979 | Kelley et al. ............... | 324/107 |
| 4,281,322 A * | 7/1981 | Nasu et al. .................. | 340/638 |
| 4,329,685 A | 5/1982 | Mahon et al. | |
| 4,635,045 A * | 1/1987 | Miller et al. ................. | 340/638 |
| 4,952,915 A * | 8/1990 | Jenkins et al. .............. | 340/639 |
| 5,262,993 A | 11/1993 | Horiguchi et al. | |
| 5,534,768 A * | 7/1996 | Chavannes et al. ......... | 323/267 |
| 5,936,269 A * | 8/1999 | Kusaba ....................... | 257/208 |
| 5,945,840 A * | 8/1999 | Cowles et al. ................ | 326/38 |
| 6,225,983 B1* | 5/2001 | Katsurabayashi et al. ... | 345/173 |
| 6,492,799 B1* | 12/2002 | Rajala et al. .................. | 324/86 |
| 6,642,601 B1* | 11/2003 | Marshall et al. ............. | 257/529 |
| 2003/0095449 A1 | 5/2003 | Kato | |

OTHER PUBLICATIONS

Blown Fuse Sensor, 1970, IBM Technical Disclosure Bullitin, vol. 13, pp. 59-60.*
Blown Fuse Sensor, 1970, IBM Technical Disclosure Bulletin, vol. 13, pp. 59-60.*

* cited by examiner

*Primary Examiner*—Lynn Feild
*Assistant Examiner*—Michael Rutland-Wallis
(74) *Attorney, Agent, or Firm*—Slater & Matsil, L.L.P.

(57) ABSTRACT

System and method for reducing power consumption in integrated circuits (IC) with fuse controlled redundant circuits. A preferred embodiment comprises detecting the status of fuses within the IC, disabling input signals to redundant circuits if none of the fuses have been blown, and enabling input signals if at least one of the fuses has been blown. By not propagating input signals to redundant circuits not being used, power consumption can be reduced significantly.

25 Claims, 7 Drawing Sheets

REDUCED POWER CONSUMPTION IN INTEGRATED CIRCUITS WITH FUSE CONTROLLED REDUNDANT CIRCUITS

TECHNICAL FIELD

The present invention relates generally to a system and method for integrated circuits, and more particularly to a system and method for reducing power consumption in integrated circuits with fuse controlled redundant circuits.

BACKGROUND

As the complexity of integrated circuits (IC) continue to increase the probability of a faulty component occurring in an IC approaches one, the faulty component may require that the IC be discarded. However, the use of redundant circuits, which are located on the IC alongside the normal circuitry of the IC, may permit the replacement of the circuitry containing faulty component. Therefore, the use of the IC may be salvaged. This can increase the IC yield and save the IC manufacturer a considerable amount of money. The redundant circuits can be activated and used in place of the faulty components (and the faulty component deactivated) by blowing fuses (such as electrical fuses (e-fuses) and/or laser-trimmed fuses). The use of fuses to activate redundant circuits and deactivate faulty components is a technique widely used in industry.

Components of an IC may be faulty due to several causes. A first cause may be that the component was not fabricated properly. For example, an imperfection may have been present on the substrate during fabrication or the fabrication procedure itself may be faulty. Improperly fabricated ICs may be discovered during IC testing, prior to packaging. If a faulty component is discovered on an IC during pre-packaging IC testing, the faulty component may be deactivated and a redundant circuit activated to take its place through the blowing of certain fuses, preferably, laser fuses since access to the IC is possible because the IC has yet to be packaged.

However, ICs may also be damaged after the pre-packaging IC testing. A second cause of faulty IC components may be that the component may have been damaged during the packaging of the IC. For example, when the die is cut from the wafer, when the wafer is cleaned, when the die is bonded to the packaging, and so forth. ICs that become faulty due to packaging are usually not discovered until post-packaging testing. Since the packaging of an IC can be a considerable amount of the overall cost of manufacturing the IC, simply discarding a faulty IC could be expensive.

A commonly used technique uses additional redundant circuits that can be activated in place of the faulty components discovered in post-packaging IC testing. These additional redundant circuits can be activated through the use of electrical fuses (e-fuses) rather than laser fuses since direct access to the IC is no longer possible. This can permit the use of a packaged IC that would have otherwise been discarded.

A disadvantage of the prior art is that the percentage of ICs that are damaged during packaging can be very small. However, to provide the ability to use those that are damaged, the redundant circuits need to be present in each IC. In order to minimize the complexity of the power and clock distribution system, the redundant circuitry usually shares a common power and clock distribution system with the remainder of the IC. This means that in the vast majority of ICs, the redundant circuitry is being actively clocked and powered although it is not being used. This can increase power consumption of the IC.

SUMMARY OF THE INVENTION

These and other problems are generally solved or circumvented, and technical advantages are generally achieved, by preferred embodiments of the present invention which can be used to reduce power consumption in an integrated circuit (IC) with fuse controlled redundant circuits.

In accordance with a preferred embodiment of the present invention, a method for reducing power consumption in integrated circuits with redundant circuitry, the method comprising determining fuse status information, disabling input signal propagation to the redundant circuitry if the fuses are un-blown, and enabling input signal propagation to the redundant circuitry if at least one of the fuses is in blown.

In accordance with another preferred embodiment of the present invention, a circuit comprising a fuse sensor circuit coupled to a functional block, the fuse sensor circuit to detect the state of fuses in the functional block, and an enable circuit coupled to the fuse sensor circuit, the enable circuit to generate an enable signal based on the state of the fuses.

In accordance with another preferred embodiment of the present invention, an integrated circuit (IC) comprising a functional block, the functional block containing circuits to perform the intended functions of the IC, a power and clock distribution system coupled to the functional block, the power and clock distribution system to provide power and clock signals to the functional block, a signal enabling circuit coupled to the functional block, the signal enabling circuit containing circuitry to generate an enable signal based on fuse status information, and a redundant circuit coupled to the signal enabling circuit, the functional block, and the power and clock distribution system, the redundant circuit containing circuitry to replace a faulty circuit in the functional block.

An advantage of a preferred embodiment of the present invention is that if redundant circuits are not required, the redundant circuits are not actively clocked or receiving power. This can reduce power consumption in an IC. Reduced power consumption can ease design constraints for an electronic device's power supply, battery, and so forth.

A further advantage of a preferred embodiment of the present invention is that the implementation of the present invention requires only a small amount of additional hardware and very little complexity, therefore including the present invention into an existing IC can be done rapidly with little expenditure.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an integrated circuit with redundant circuitry. An example of such an integrated circuit would be a memory IC, such as a random access memory (RAM) IC (such as dynamic RAM, synchronous RAM, flash RAM, and so forth). The invention may also be applied, however, to other circuits (including non-integrated circuits and multi-chip modules) that feature redundant circuitry that can be unpowered and/or unclocked if unused to reduce power consumption.

Figure 1:
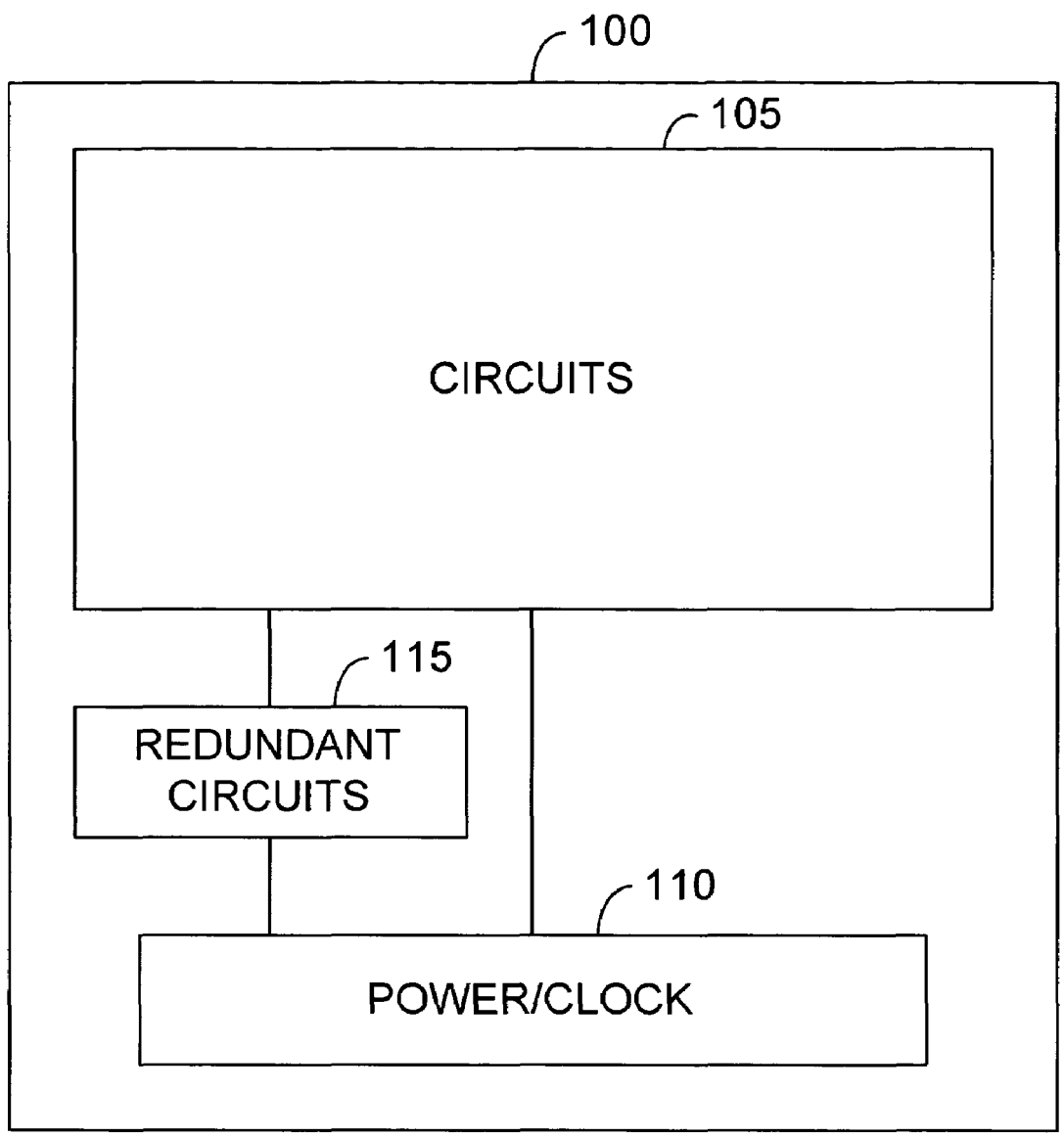
FIG. 1 is a diagram of an integrated circuit (IC)

With reference now to FIG. 1, there is shown a diagram illustrating an integrated circuit (IC) 100. The IC 100, as illustrated in FIG. 1, features a circuits block 105 which may contain circuitry used to provide desired functionality, a power/clock block 110 which can be used to provide needed power and clocks to the circuits block 105 and other portions of the IC 100, and a redundant circuit 115 which can be used to replace certain portions of the circuits block 105 should those portions be found to be defective. Note that input signals and output signals (such as data and control signals) and their attendant signal lines have been omitted from FIG. 1 in order to simplify the figure. Note also that a single IC may have more than one redundant circuit.

Not displayed are fuses that can be used to deactivate the faulty portion(s) of the circuit block 105 and to activate the redundant circuits 115 so that the redundant circuit 115 may take the place of the deactivated faulty portion(s) of the circuit block 105. Typically, there are two types of fuses that are used. A first type is commonly referred to as a laser fuse. Laser fuses can be blown through the application of a laser that may be directly applied onto the laser fuse. The laser vaporizes the material making up the laser fuse and hence causing an electrical break. A second type is commonly referred to as an electrical fuse, or e-fuse. E-fuses can be blown through the application of a voltage or current of sufficient magnitude. E-fuses offer an advantage over laser fuses in that the e-fuses can be blown when there is no direct access to the IC and hence the fuses. Laser fuses can only be blown if the laser can be shown directly upon the fuses.

Figure 2:
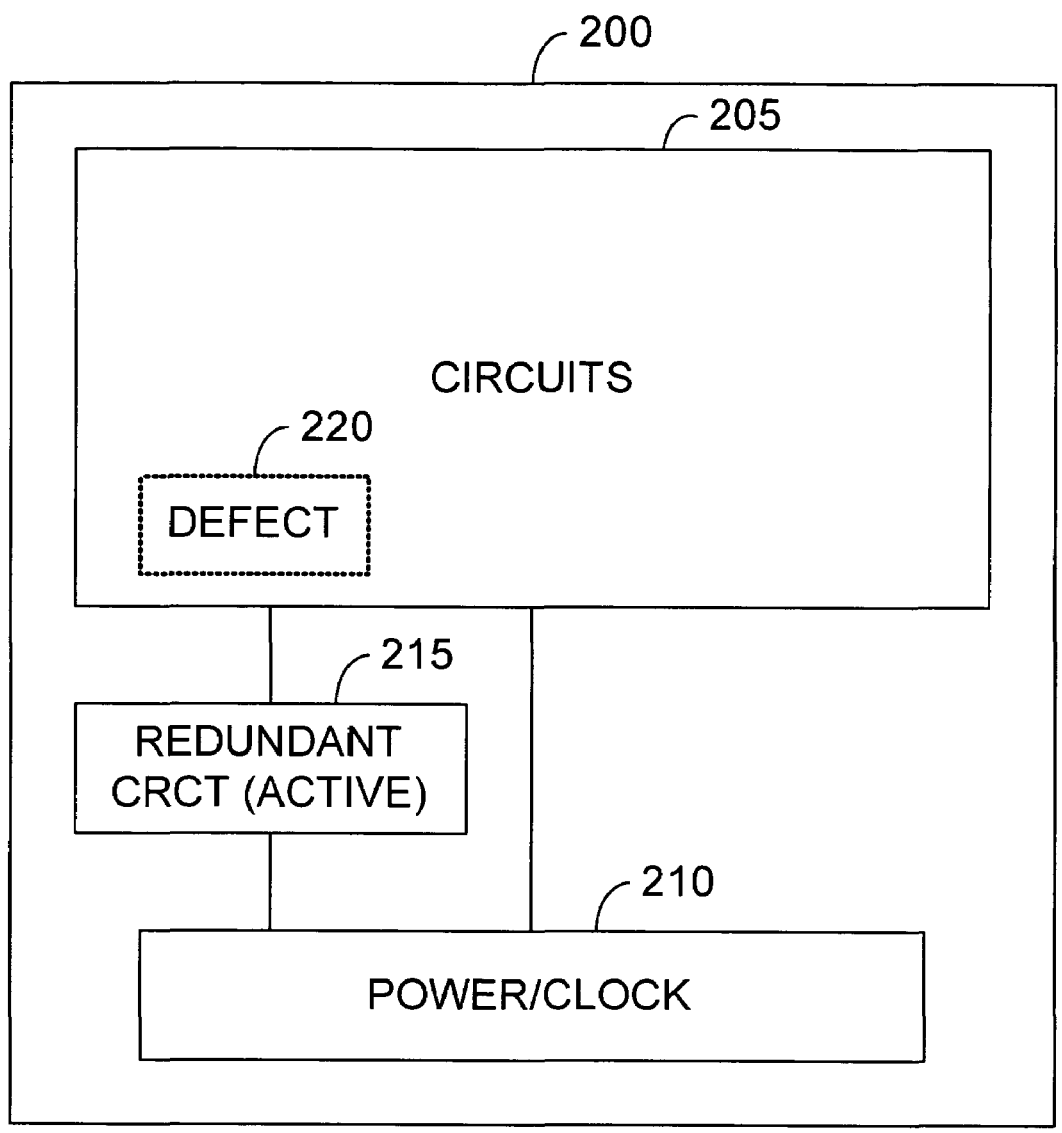
FIG. 2 is a diagram of an IC wherein a redundant circuit has been activated to replace a faulty component.

With reference now to FIG. 2, there is shown a diagram illustrating the activation of a redundant circuit 215 to replace a defective circuit 220 found in an IC 200. As illustrated in FIG. 2, a portion of the IC 200 was found to be defective (shown as the defective circuit 220). A redundant circuit 215 was activated (preferably through the use of fuses) to replace the defective circuit 220 and the defective circuit 220 was deactivated (preferably through the use of fuses).

Typically, until they are activated, the redundant circuit 215 will sit idle, performing no operations, although it may be consuming power through the fact that it is being supplied with necessary power and clocks, just as if it was operating. In a typical IC, the power and clock distribution system may be shared between various parts of the IC. For example, a circuits block 205 may be coupled to the same power and clock distribution system as the redundant circuit 215.

Figure 3:
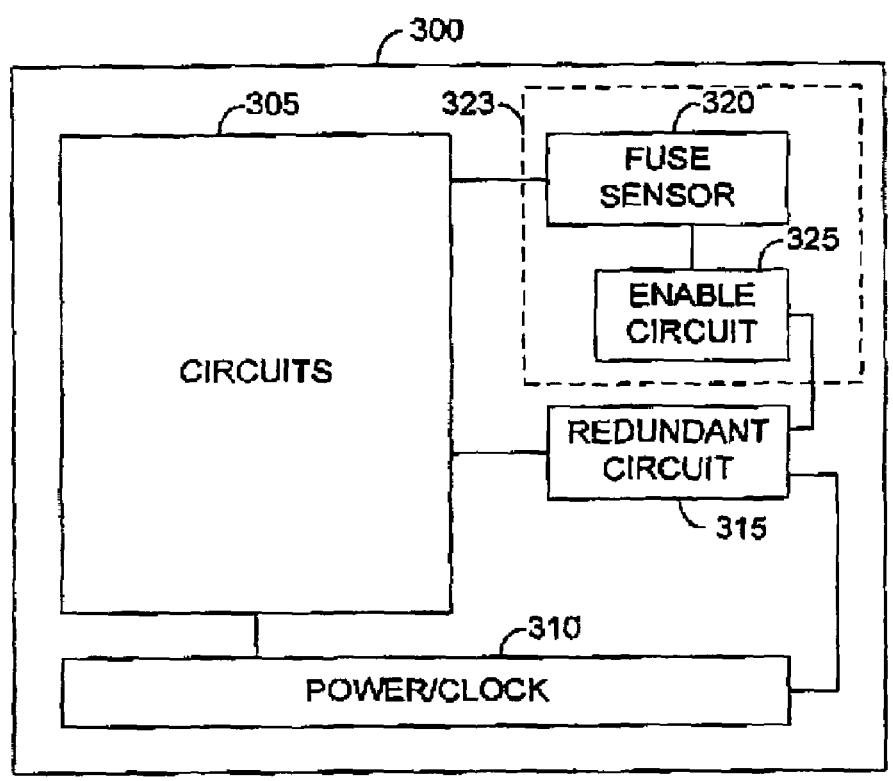
FIG. 3 is a diagram of an IC with redundant circuitry and circuitry to reduce power consumption, according to a preferred embodiment of the present invention.

With reference now to FIG. 3, there is shown a diagram illustrating an IC 300 with redundant circuitry and circuitry to reduce power consumption, according to a preferred embodiment of the present invention. As in the ICs discussed previously, the IC 300 features a circuits block 305 and power and clock block 310. The IC 300 also has a redundant circuit 315. Note that the actual number of redundant circuits in an IC may be dependent upon a design decision made by the IC's designer. A trade-off may be made between the number of faulty circuits that can be replaced and the amount of space in the IC 300 being devoted to the redundant circuits.

In order to support a reduction in power consumption, the IC 300 may have a signal enabling circuit 323 that includes a fuse sensor circuit 320 and an enable circuit 325. According to a preferred embodiment of the present invention, the fuse sensor circuit 320 can have the ability to determine the state of fuses (both laser and e-fuses if necessary) in the IC 300. A fuse may be un-blown or blown. The enable circuit 325 may then make use of fuse status information provided by the fuse sensor circuit 320 to enable power and clock distribution to the redundant circuit 315. When the redundant circuit 315 is enabled, then power and clock signals (provided by the power and clock block 310) may be permitted to propagate through the redundant circuit 315. When not enabled, the power and clock signals (or only clock signals, depending upon implementation of the present invention) may not be permitted to propagate through the redundant circuit 315. In the case of CMOS ICs, when switching is not occurring, current drain will be significantly reduced.

The reduction in power consumption can be achieved by disabling the propagation of power signals into the redundant circuit, disabling the propagation of clock signals into the redundant circuit, or disabling the propagation of both the power and clock signals into the redundant circuit. Furthermore, the propagation of input signals, such as data and control signals, can be stopped to further reduce power consumption. The degree to which the power consumption can be reduced can depend upon the architecture of the IC and how much additional hardware can be added to the IC. For example, if the power distribution system of the power and clock block 310 is arranged in a grid-like pattern, it may be difficult to stop the propagation of the power into the redundant circuit without the addition of a significant amount of hardware.

According to a preferred embodiment of the present invention, the enable circuit 325 may generate a single enable signal for all redundant circuits in the IC 300 (should the IC 300 have more than one redundant circuit). By generating only a single enable signal, the complexity of the enable circuit 325 (and possibly the fuse sensor circuit 320) can be kept at a minimum. Therefore, simplifying design and implementation. Furthermore, if the IC 300 was designed with a small number of redundant circuits, a single enable signal may be sufficient. Alternatively, the enable circuit 325 may generate a plurality of enable signals. One enable signal can be used to control a single redundant circuit or one enable signal can be used to control several redundant circuits (with no specific requirement that every enable signal control the same number of redundant circuits).

Figure 4A:
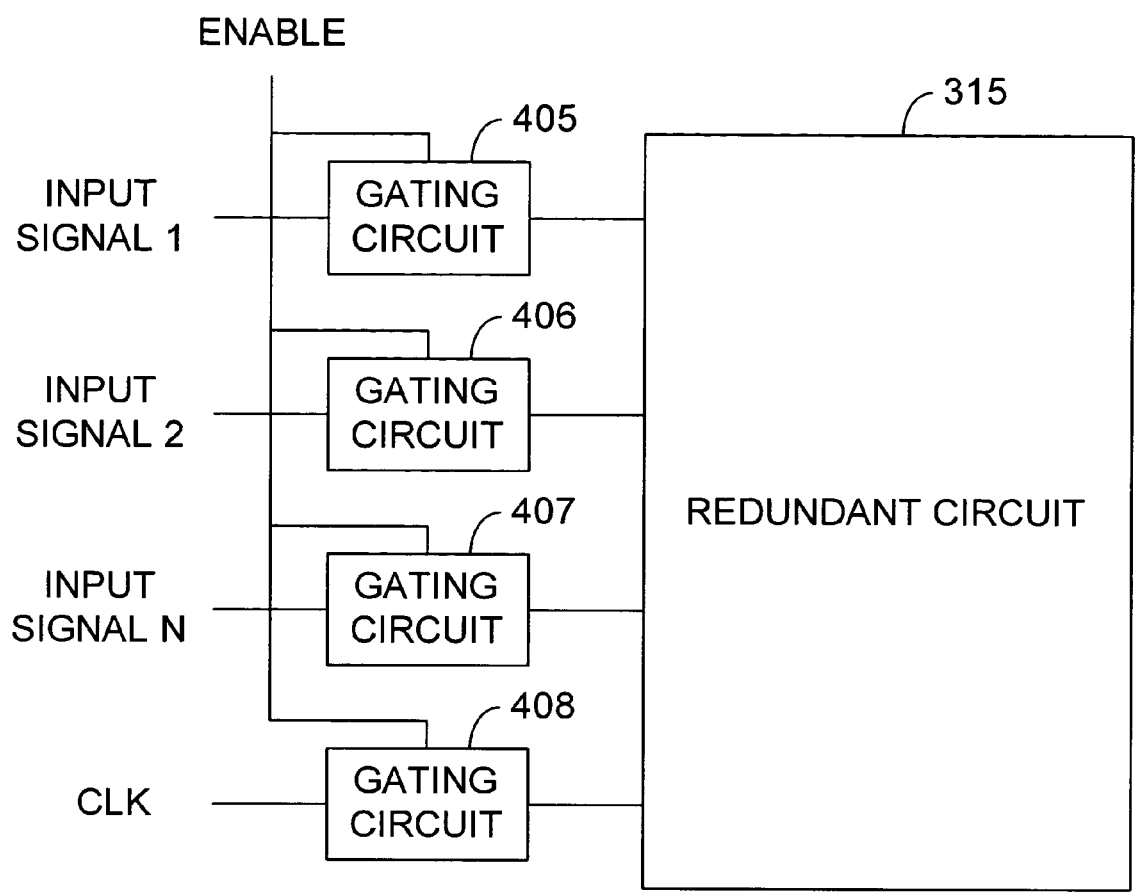
FIG. 4a is a diagram of gating circuits used to control the propagation of signals into a redundant circuit, according to a preferred embodiment of the present invention.

With reference now to FIG. 4a, there is shown a diagram illustrating the use of an enable signal to control the propagation of clock and input signals (and perhaps power) to the redundant circuit 315, according to a preferred embodiment of the present invention. One way to reduce power consumption in integrated circuits (especially ones fabricated using CMOS technology) is to stop signals from switching (changing in value, from a high value to a low value and back). In a CMOS circuit, when switching is not occurring, power consumption can essentially drop to a negligible level, even when there is a voltage potential present on the lines.

The enable signal (as generated by the enable circuit 325 (FIG. 3)) can be used to stop the switching of signals provided to the redundant circuit 315. The signals that can be controlled by the enable signal may include clock signals and input signals (such as addresses, data values and control signals). The enable signal can be provided to a gating circuit (such as gating circuits 405 through 408) and when the enable signal is active, the gating circuit can prevent any switching present on an input signal input from propagating. For example, the gating circuit 405 can prevent any switching in input signal 1 from propagating to the redundant circuit 315 when the enable signal is active. As discussed previously, a single enable signal can be used to control all gating circuits (as displayed in FIG. 4a) or multiple enable signals can be used to control the gating circuits.

Figure 4B:
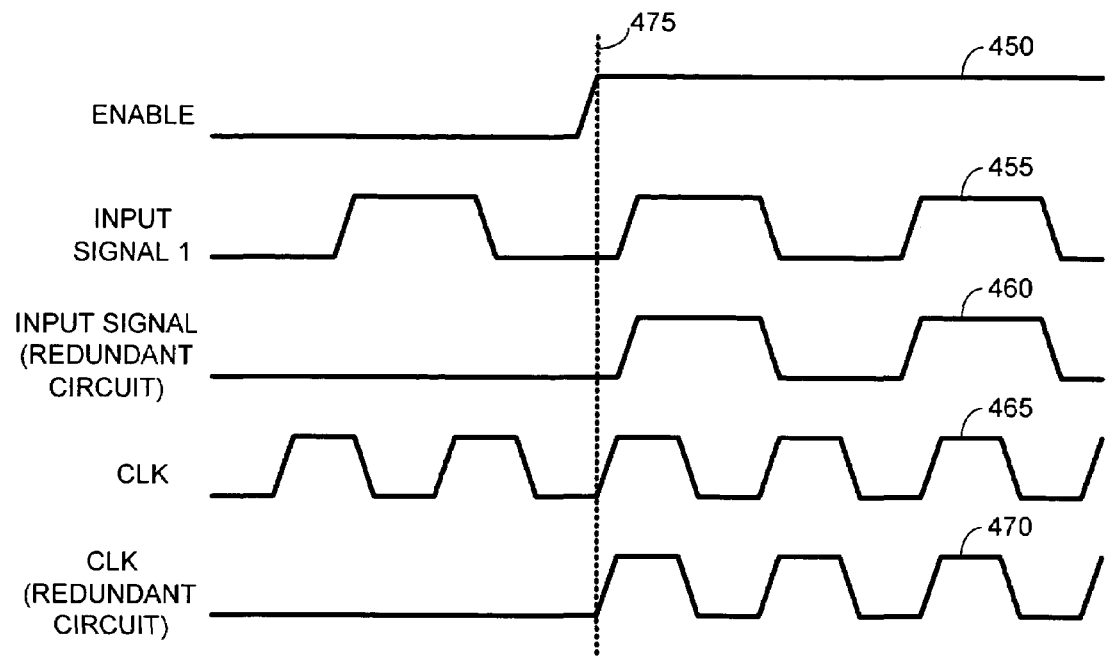
FIG. 4b is a timing diagram showing the function of the gating circuits, according to a preferred embodiment of the present invention.

With reference now to FIG. 4b, there is shown a timing diagram illustrating the effect of an enable signal on input signals to the redundant circuit, according to a preferred embodiment of the present invention. A first curve 450 illustrates the enable signal changing from an inactive (disable) state to an active (enable) state, with the transition being indicated with a dashed vertical line 475. A second curve 455 illustrates an input signal 1. Note that the second curve 455 may illustrate the input signal 1 at a point prior to a gating circuit. A third curve 460 illustrates an output of a gating circuit with the input signal 1 as input. The third curve 460 shows that while the enable signal is inactive (portions of the third curve 460 to the left of the dashed vertical line 475), the output of the gating circuit remains low and that after the enable signal becomes active (portions of the third curve 460 to the right of the dashed vertical line 475), the output of the signal tracks the input signal 1 (the second curve 455). Similarly, a fourth curve 465 and a fifth curve 470 illustrate a clock signal prior to a gating circuit and as output of the gating circuit.

According to a preferred embodiment of the present invention, once an enable signal becomes inactive (disable), output of the gating circuits controlled by the enable signals become low and remains low. Alternatively, the output of the gating circuits controlled by the enable signals come high and remains high. According to yet another preferred embodiment of the present invention, the output of the gating circuits controlled by the enable signals remains at their last level prior to the enable signal becoming active and remains at that level.

Figure 5:
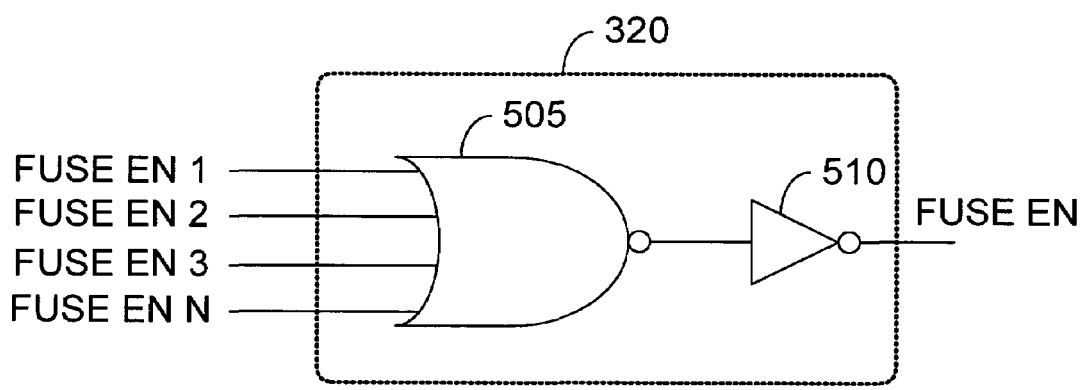
FIG. 5 is a diagram of an exemplary fuse sensor circuit, according to a preferred embodiment of the present invention.

With reference now to FIG. 5, there is shown a diagram illustrating an exemplary fuse sensor circuit 320, according to a preferred embodiment of the present invention. The fuse sensor circuit 320 may be used to combine state information from a plurality of master fuses (or enable fuses) into a single signal value, referred to as "FUSE EN," that can be used to indicate that a repair with a redundant circuit may have been performed and that redundant circuit 315 may require clock, power, and input signals. State information from a master fuse may be used to indicate that a repair has indeed taken place and that a redundant circuit is being used. A single master fuse may take the place of a plurality of fuses. Therefore, by combining information from master fuses, the amount of information being combined can be smaller and can possibly result in a less complicated fuse sensor circuit 320. Alternatively, the fuse information for each fuse in the IC can be combined in the fuse sensor circuit 320.

If there is a single redundant circuit 315 in the IC, then the design of the fuse sensor circuit 320 can be straight forward, essentially, if any fuse has been blown (indicating a repair), then the redundant circuit 315 should be enabled. For example, there may be N different fuses that can be blown to perform a repair. Rather than using the N individual pieces of fuse status information, the combined fuse status information (FUSE EN) can be used to determine whether or not to enable or disable signal switching for the redundant circuit 315. According to a preferred embodiment of the present invention, a multi-input NOR (negative-or) gate 505 can be used to combine the N individual pieces of fuse status information. Alternatively, a non-inverting OR gate can be used. An inverter 510 can be used, depending on if the combined fuse status information signal should be active low or active high.

If there are multiple redundant circuits in an IC and each redundant circuit can be activated independently of one another, then a fuse sensor circuit may be designed to generate multiple enable signals depending upon which fuses have been blown. If the fuse sensor circuit is designed to generate fuse status information for multiple enable signals, then one possible implementation could involve the use of multiple multi-input NOR gates (not shown), with each multi-input NOR gate receiving fuse status information from fuses that are to be blown to activate a particular redundant circuit. The output from that particular multi-input NOR gate (perhaps referred to as FUSE EN I, for the i-th FUSE EN signal) could then be used to generate an enable signal for the particular redundant circuit. An inverter may be present at the output of each of the multi-input NOR gates.

Figure 6:
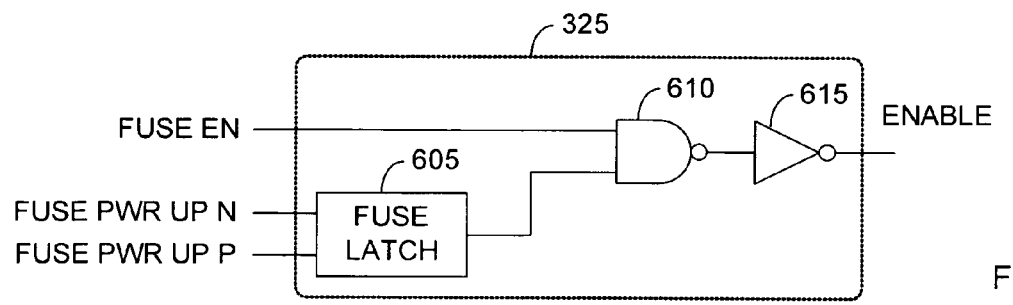
FIG. 6 is a diagram of an exemplary enable circuit, according to a preferred embodiment of the present invention.

With reference now to FIG. 6, there is shown a diagram illustrating an exemplary enable circuit 325, according to a preferred embodiment of the present invention. The combined fuse status information signal (FUSE EN) generated by the fuse sensor circuit 320 (FIG. 5) can be sufficient to generate an enable signal in ICs for normal operation. However, as an additional control mechanism, a laser fuse latch 605 with inputs (labeled "FUSE PWR UP N" and "FUSE PWR UP P") that can be used to sense a state of a fuse during power up. According to a preferred embodiment of the present invention, the control mechanism can be used to prevent a situation wherein all e-fuses may erroneously be stuck in a blown state. The control mechanism can permit the use of redundancy in normal operations.

The signals "FUSE PWR UP N" and "FUSE PWR UP P" can be used during power-on of the IC to determine the blown or unblown state of the fuses. FUSE PWR ON P may be an active low and initially resets the fuse latch (to a "blown" state for initially conducting fuses like laser fuses, to the "un-blown" state for initially non-conducting fuse types like most electrical fuses). FUSE PWR ON P then may go high and stays high, followed by an active high pulse on FUSE PWR ON N, which can open a transistor (not shown) in series with the fuse. Depending on the conductivity of the fuse, the fuse latch may or may not change its state during this pulse. FUSE PWR ON N then may return to a low level and the fuse latch can permanently store the sensed fuse state. Note that the fuse sensor circuit 320 (FIG. 3) may also make use of the signals FUSE PWR UP N and FUSE PWR UP P to sense the electrical fuses.

According to a preferred embodiment of the present invention, an output from a fuse sensor circuit (FUSE EN) can be combined with the output of the fuse latch 605 to provide an enable signal for a redundant circuit. According to a preferred embodiment of the present invention, the enable signal can become active only if both the output of the fuse sensor circuit and the output of the fuse latch 605 are active (true).

Figure 7A:
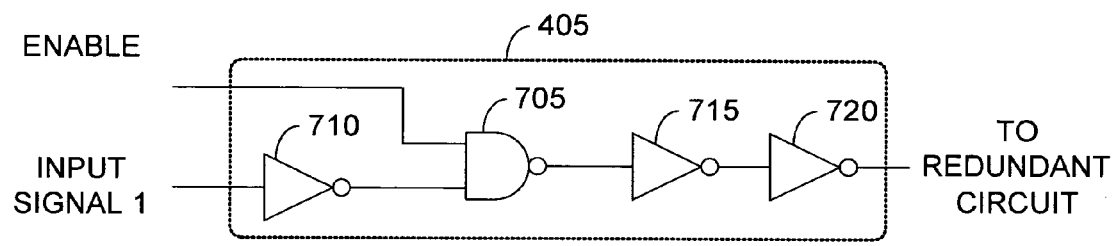
FIGS. 7a and 7b are diagrams of exemplary gating circuits, according to a preferred embodiment of the present invention.
Figure 7B:
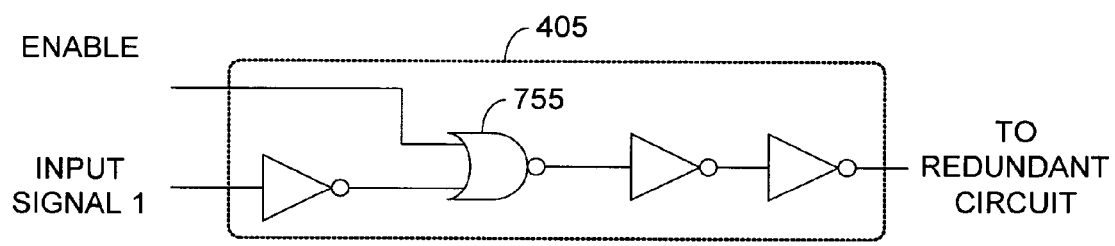

With reference now to FIG. 7a, there is shown a diagram illustrating an exemplary gating circuit 405, according to a preferred embodiment of the present invention. The gating circuit 405 can be used to permit a signal at its input to propagate (or not) depending on a control input. According to a preferred embodiment of the present invention, the control signal for the gating circuit 405 is an enable signal from an enable circuit. A NAND (negative-AND) gate 705 with a first input being the control signal and a second input being the signal to be propagated may be used to control the propagation of the input signal. If the control signal is active, then the input signal is not propagated. Inverters 710, 715, and 720 may be used as buffers. Output of the gating circuit 405 can be connected to circuitry inside a redundant circuit. Note that other logic can be used in place of the NAND gate 705 and maintain desired functionality. FIG. 7b illustrates an alternate embodiment of the present invention where in a NOR (negative-OR) gate 755 is used in place of the NAND gate 705. The NOR gate 755 can be used in situations wherein alternate signal polarity is required.

Figure 8:
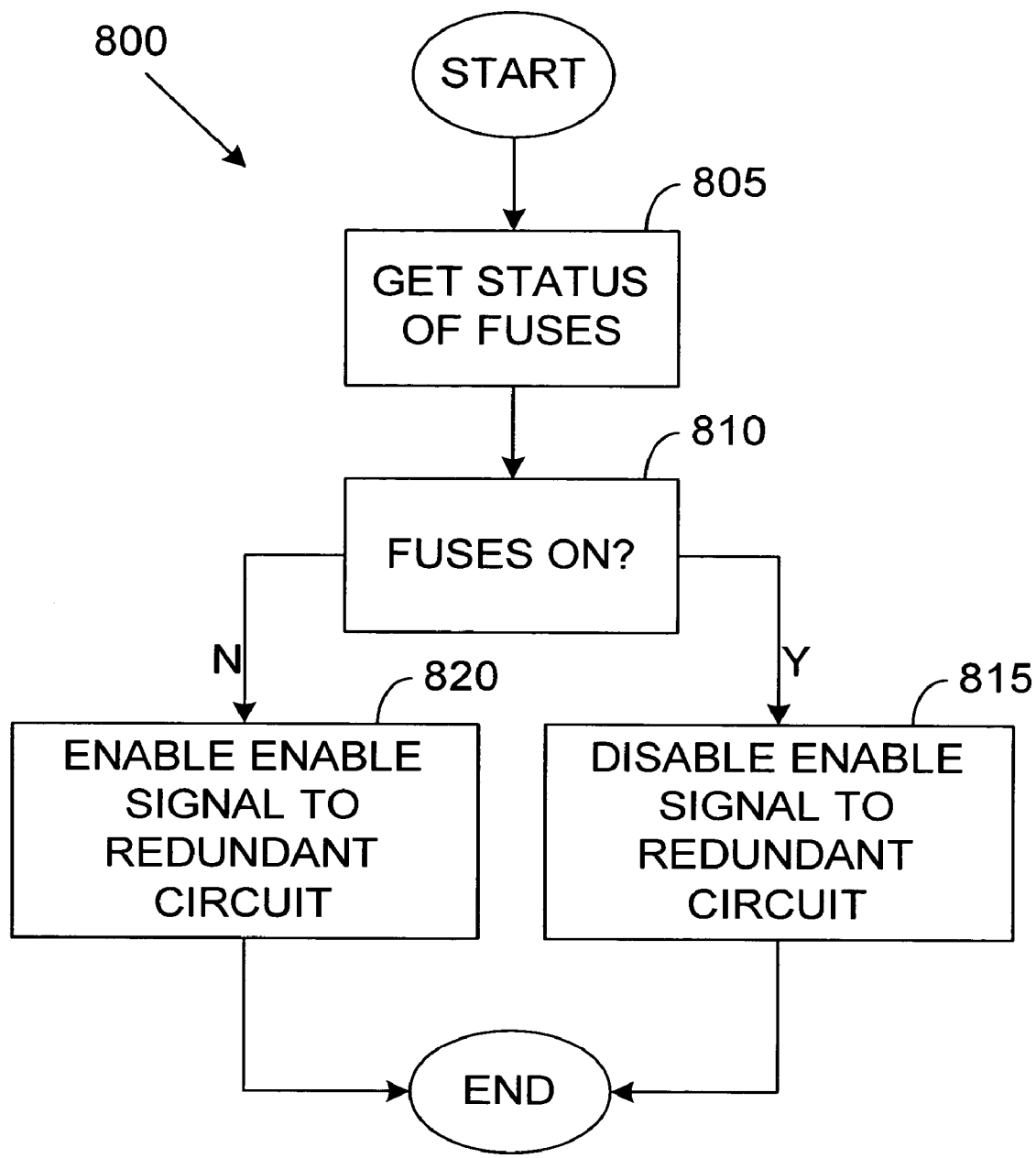
FIG. 8 is a diagram of an algorithm used to determine the value of an enable signal, according to a preferred embodiment of the present invention.

With reference now to FIG. 8, there is shown a diagram illustrating an algorithm 800 that can be used to determine the value of an enable signal, according to a preferred embodiment of the present invention. According to a preferred embodiment of the present invention, the algorithm 800 may be executed during power-up of the IC. During power up, the status of the fuses may be determined (block 805). Note that the fuses may be master fuses or regular fuses. This may be performed by the fuse sensor circuit 320 (FIG. 5). The states of the fuses can then be checked (block 810). This may be as simple as determining the value of a single signal line, such as the FUSE EN output from the fuse sensor circuit 320. If none of the fuses have been blown, then the enable signal should be set to disable (block 815), preventing signals from propagating to the redundant circuit. If at least one of the fuses has been blown, then the enable signal should be set to enable (block 820), allowing signals to propagate to the redundant circuit. Note that if there are multiple redundant circuits, additional decoding may be needed to enable the enable signal to the proper redundant circuits.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit comprising:
    a functional circuit;
    a redundant circuit;
    a fuse sensor circuit coupled to a functional block, the fuse sensor circuit to detect the state of fuses in the functional block; and
    an enable circuit coup led to the fuse sensor circuit, the enable circuit to generate an enable signal if the state of the fuses indicates that the redundant circuit is to be activated to replace the functional circuit,
    wherein propagation of clock and/or power signals to the redundant circuit is permitted only if the enable signal is generated.

2. The circuit of claim 1, wherein the fuses are master fuses, and wherein a blown master fuse indicates that the redundant circuit is to be activated.

3. The circuit of claim 1, wherein there is a plurality of fuses in the functional block, and wherein the fuse sensor circuit combines status signals from each fuse to produce a single fuse status signal.

4. The circuit of claim 3, wherein the fuse sensor circuit is a multi-input negative-OR (NOR) gate, wherein the inputs to the multi-input NOR gate are status signals from fuses in the functional block.

5. The circuit of claim 1, wherein the fuse sensor circuit generates multiple outputs, and wherein each output is to be used to generate a different enable signal.

6. The circuit of claim 5, wherein each output is based on status signals from a subset of fuses from a plurality of fuses in the functional block, and wherein each output is generated by a multi-input negative-OR (NOR) gate, wherein the inputs to the multi-input NOR gate are status signals from the subset of fuses.

7. The circuit of claim 6, wherein each subset of fuses is mutually exclusive.

8. The circuit of claim 1, wherein the enable circuit generates the enable signal based on an output produced by the fuse sensor circuit.

9. The circuit of claim 1, wherein the enable circuit generates the enable signal based on an output produced by the fuse sensor circuit and a fuse status signal used to enable redundancy.

10. The circuit of claim 9, wherein a negative-AND gate combines the output produced by the fuse sensor circuit and the fuse status signal used to enable redundancy.

11. An integrated circuit (IC) comprising:
a functional block, the functional block containing circuits to perform the intended functions of the IC;
a power and clock distribution system coupled to the functional block, the power and clock distribution system to provide power and clock signals to the functional block;
a signal enabling circuit coupled to the functional block, the signal enabling circuit containing circuitry to generate an enable signal based on fuse status information; and
a redundant circuit coupled to the signal enabling circuit, the functional block, and the power and clock distribution system, the redundant circuit containing circuitry to replace a faulty circuit in the functional block,
wherein the signal enabling circuit is configured to generate the enable signal if the fuse state information indicates that the redundant circuit is to be activated to replace the functional block, and
wherein propagation of the power and/or clock signals to the redundant circuit is permitted only if the enable signal is generated.

12. The IC of claim 11, wherein the signal enabling circuit comprises:
a fuse sensor circuit coupled to the functional block, the fuse sensor circuit to detect the state of fuses in the functional block; and
an enable circuit coupled to the fuse sensor circuit, the enable circuit to generate an enable signal based on the state of the fuses.

13. The IC of claim 11 further comprising a plurality of gating circuits, a gating circuit for each input signal to the redundancy circuit.

14. The IC of claim 13, wherein the gating circuit can stop the propagation of a signal at its input depending upon the value of a control signal input.

15. The IC of claim 14, wherein the control signal input is the enable signal.

16. The IC of claim 13, wherein the gating circuit is coupled to each power signal, clock signal, data signal, and control signal to the redundant circuit.

17. The IC of claim 13, wherein the gating circuit is coupled to each clock signal, data signal, and control signal to the redundant circuit.

18. The IC of claim 11, wherein the IC is a memory circuit.

19. The IC of claim 18, wherein the IC is a dynamic random access memory.

20. An integrated circuit (IC) comprising:
a functional block, the functional block containing circuits to perform the intended functions of the IC;
a power and clock distribution system coupled to the functional block, the power and clock distribution system to provide power and clock signals to the functional block;
a signal enabling circuit coupled to the functional block, the signal enabling circuit containing circuitry to generate an enable signal based on fuse status information;
a redundant circuit coupled to the signal enabling circuit, the functional block, and the power and clock distribution system, the redundant circuit containing circuitry to replace a faulty circuit in, the functional block; and
a plurality of gating circuits, a gating circuit for each input signal to the redundancy circuit, wherein the gating circuit can stop the propagation of a signal at its input depending upon the value of the enable signal.

21. The IC of claim 20, wherein the signal enabling circuit comprises:
a fuse sensor circuit coupled to the functional block, the fuse sensor circuit to detect the state of fuses in the functional block; and
an enable circuit coupled to the fuse sensor circuit, the enable circuit to generate the enable signal based on the state of the fuses.

22. The IC of claim 20, wherein the gating circuit is coupled to each power signal, clock signal, data signal, and control signal to the redundant circuit.

23. The IC of claim 20, wherein the gating circuit is coupled to each clock signal, data signal and control signal to the redundant circuit.

24. The IC of claim 20, wherein the IC is a memory circuit.

25. The IC of claim 24, wherein the IC is a dynamic random access memory.

* * * * *

UNITED STATES PATENT AND TRADEMARK OFFICE
CERTIFICATE OF CORRECTION

PATENT NO. : 7,112,895 B2
APPLICATION NO. : 10/641812
DATED : September 26, 2006
INVENTOR(S) : Hokenmaier It is certified that error appears in the above-identified patent and that said Letters Patent is hereby corrected as shown below:

Title Page
Item 56, Other Publications; delete the first citation of: Blown Fuse Sensor, 1970, IBM Technical Disclosure Bullitin, vol. 13, pp, 59-60.*

Column 8, line 36; delete "coup led" and insert --coupled--
Column 10, line 22; delete "circuit in, the" insert --circuit in the--

Signed and Sealed this

Second Day of January, 2007

JON W. DUDAS
*Director of the United States Patent and Trademark Office*